United States Patent

Chen

[11] Patent Number: 5,580,387
[45] Date of Patent: Dec. 3, 1996

[54] CORRUGATED WAVEGUIDE FOR A MICROWAVE PLASMA APPLICATOR

[75] Inventor: Chi-Nan Chen, Hsinchu, Taiwan

[73] Assignee: Electronics Research & Service Organization, Hsinchu, Taiwan

[21] Appl. No.: 496,229

[22] Filed: Jun. 28, 1995

[51] Int. Cl.$^6$ .............. C23C 16/00; H01J 7/24; H01P 3/23
[52] U.S. Cl. .............. 118/723 MW; 315/111.41; 333/242; 333/99 PL; 118/723 MR
[58] Field of Search .............. 333/157, 239, 333/242, 248, 251, 99 PL; 315/111.21, 111.41, 111.81, 502; 313/231.31, 231.41, 362.1; 118/723 MW, 723 MR

[56] References Cited

U.S. PATENT DOCUMENTS 2,199,083  4/1940  Schelkunoff .............. 333/239 X
3,289,111  11/1966  Carr .............. 333/242 X

OTHER PUBLICATIONS

"Characterization of a New Electron Cyclotron Resonance Source Working with Permanent Magnets", by G. Neumann & K.-H. Kretschmer, J.Vac.Sci.Technol. B9(2) Mar./Apr. 1991 pp. 334–338.

"Distributed Electron Cyclotron Resonance in Silicon Processing: Epitaxy and Etching", by Rudolf R. Burke, J. Pelletier, C. Pomot, & L. Vallier, J.Vac.Sci.Technol.A8(3) May/Jun. '90.

"Electron Cyclotron Resonance Microwave Discharges for Etching and Thin–Film Deposition" by Jes Asmussen, J. Vac. Sci. Technol. A7(3), May/Jun. 1989, pp. 883–893.

*Primary Examiner*—Paul Gensler
*Attorney, Agent, or Firm*—Barnes, Kisselle, Raisch, Choate, Whittemore & Hulbert, P.C.

[57] ABSTRACT

A corrugated waveguide is disclosed comprising a cylindrical body with outer and inner surfaces. The inner surface is provided with plurality of ridges uniformly spaced around the inner surface. Presence of 2n ridges secures the formation of microwaves with stable $TE_{n1}$ modes where n is an integer and n>1. Disclosed also is an electron cyclotron resonance system for plasma processing of which system the corrugated waveguide described in the above is a part.

6 Claims, 1 Drawing Sheet

5,580,387

CORRUGATED WAVEGUIDE FOR A MICROWAVE PLASMA APPLICATOR

FIELD OF THE INVENTION

The present invention generally relates to a waveguide for microwave plasma applicators used particularly though not exclusively in semiconductor industry as a component of equipment for performing a number of specific processes such as etching or chemical vapor deposition of thin films. Especially, the invention relates to a corrugated waveguide for microwave plasma applicators that has a large useable area and a stable mode.

BACKGROUND OF THE INVENTION

Applicability of a high energy plasma to a number of key semiconductor fabrication processes has made it a virtually indispensable production technology. An essential step in developing microwave plasma processing is the electron cyclotron resonance discharge where, as the name of the resonance implies, the microwave field oscillates in resonance with the electron cyclotron motion about the magnetic field lines. In other words, where microwave energy is coupled to the natural resonant frequency of the electron gas in the presence of a static magnetic field and when the electron cyclotron frequency and the excitation frequency are equal to each other, the condition for the resonance happens. In practice, this requirement can be met, for example in a volume within the discharge, with the static magnetic field made correspondent to resonance, that is where the both frequencies coincide with each other, and a component of electric field is normal to the static magnetic field. The electrons are accelerated in this electron cyclotron resonance volume ionizing and exciting the neutral gas. As a result, a plasma comes into existence varying from a weakly to a highly ionized state depending on discharge pressure, gas flow rate, and input microwave power. The power absorption is localized to the resonance zone in an electron cyclotron resonance source resulting in very precise control on the power deposition profile.

In a conventional electron cyclotron resonance discharge, the plasma region produced is not extendible over a large area, and is generally limited to a diameter of approximately 8–18 cm. It is mainly limited by the use of waveguide as the applicator while the waveguide operates in the fundamental mode.

Various efforts have been mounted in making larger area plasma. There are at least three types of designs that seem to outperform the others. The type described in J. Asmussen. "Electron Cyclotron Resonance Microwave Discharges For Etching And Thin-film Deposition." J. Vac. Sci. Technol. A7(3), May/June 1989, 883–893, utilizes a partial area of a large cavity to produce plasma while the remaining area is used for mode stabilization. The type described in G. Neumann, et al. "Characterization Of A New Electron Cyclotron Resonance Source Working With Permanent Magnets." J. Vac. Sci. Technol. B9(2), March/April 1991, 334–338, harnesses a horn antenna as the applicator which operates in the $TM_{01}$ mode. The diameter of the plasma can reach 20 cm. Even though this is an improved design, however, it has reached its upper limit in the plasma diameter and the area can no longer be increased. The third type which is described in R. R. Burke et al. "Distributed Electron Cyclotron Resonance in Silicon Processing: Epitaxy And Etching." J. Vac. Sci. Technol. A8(3), May/June 1990, 2931–2938, requires difficult impedance matching and uneasy applicator design. The processing is complicated when the antenna is used inside the plasma.

It has ben generally observed that in attempts to extend microwave plasma over larger areas, an unstable mode is easily produced resulting in a mode conversion loss and uneven distribution of the plasma.

It is therefore an object of the present invention to provide a large cavity waveguide that does not have the drawbacks of the prior art waveguides.

It is another object of the present invention to provide a large cavity waveguide that has a corrugated interior construction.

It is still another object of the present invention to provide a large cavity waveguide that can be operated at a stable microwave mode.

It is yet another object of the present invention to provide a large cavity waveguide that has the generated plasma extended over an area larger than the prior art waveguides.

SUMMARY OF THE INVENTION

In accordance with one aspect of the present invention, there is provided a corrugated waveguide for a microwave plasma applicator. The wave guide comprises a body and a plurality of ridges. The waveguide body has an outer surface and an inner surface, the inner surface having a circular cross-section. Ridges are longitudinally extended along a direction of wave propagation in the waveguide, they are 2n in number and arranged on the internal surface of the body in such a way that they are uniformly spaced about this inner surface to provide an operating mode of a $TE_{n1}$ type where n is an integer and n>1.

There may be four of said ridges to provide the $TE_{21}$ operating mode.

There may be six of said ridges to provide the $TE_{31}$ operating mode.

All of the ridges are identical in form and each of them constitutes in a transversal cross-section a truncated sector, with an innermost surface of each of the ridges being arc-wise and concentric with the inner surface of the waveguide body.

According to another aspect of the invention, there is provided an electron cyclotron resonance system for plasma processing. The system comprises a means for producing microwaves; a transmission means for bringing the microwaves to an applicator; a quartz chamber inserted in the applicator, for burning a plasma; a source of magnetic field surrounding the applicator in an area of the applicator where it accommodates the quartz chamber; and a working chamber communicating with the quartz chamber, for plasma processing products. The transmission means includes a waveguide and may also include a coaxial line. The waveguide contains a horn shaped radiator switching to the applicator. And the applicator includes a corrugated waveguide comprising a body and a plurality of ridges. The body has an outer surface and an inner surface, and the inner surface has a circular cross-section, whereas ridges of the plurality of ridges longitudinally extend along a direction of wave propagation in the waveguide. The ridges are arranged on the internal surface, uniformly spaced about it, and 2n in number to provide an operating mode of a $TE_{n1}$ type where n is an integer and n>1.

There may be four, six, eight, etc. ridges in the applicator to provide $TE_{21}$, $TE_{31}$, $TE_{41}$, etc. operating modes, respectively.

All of the ridges are identical in form and each of them constitutes, in the transversal cross-section, a truncated sector, with an innermost surface of each of the ridges being arc-wise and concentric with the inner surface of the body.

In an end area of the applicator surrounded by the source of magnetic field, a ring strap for microwave mode selection is located.

BRIEF DESCRIPTION OF THE DRAWINGS

Other objects, features and advantages of the present invention will become apparent upon consideration of the specification and the appended drawings, in which.

DETAILED DESCRIPTION OF THE PREFERRED EMBODIMENT

Figure 1:
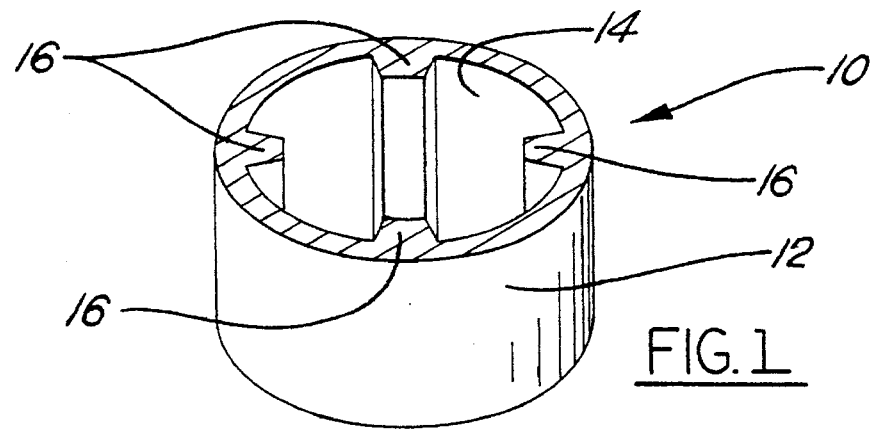
FIG. 1 is a perspective view of a part of a waveguide according to the present invention in the preferred embodiment of the first aspect thereof.
Figure 2A:
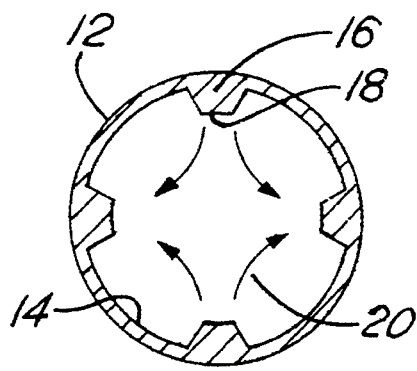
FIG. 2A–2C are top views of the preferred embodiment of FIG. 1, and of two alternate embodiments of the present invention in its first aspect.
Figure 2B:
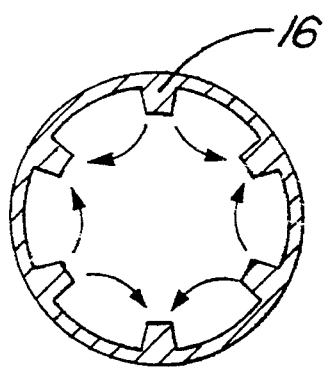
Figure 2C:
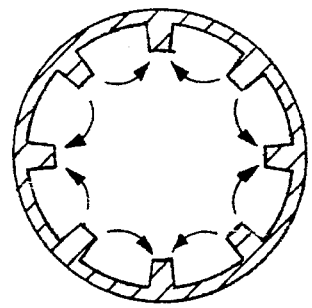

In accordance with the present invention, a large cavity waveguide that produces stable mode plasma is provided.

When a small cavity waveguide is changed to a large cavity waveguide, the mode of the microwave frequently changes from a fundamental mode to a plurality of high order modes. In order to avoid a mode conversion loss (or mode skip), it is desirable to produce a stable and singular high order mode. A suitable mode conversion element and a suitable waveguide (or applicator) shape must be carefully designed in order to achieve a stable mode and the least mode conversion loss.

Under the above described conditions, in order to produce a large area and stable mode microwave plasma, the present invention provides an applicator in the shape of a corrugated or ridged waveguide. A perspective view of a section of this waveguide is presented in FIG. 1. A waveguide 10 has a body with an outer surface 12 and an inner surface 14. Both outer 12 and inner 14 surfaces are preferably of a circular transversal cross-section. The inner surface of the waveguide is made with ridges 16. The ridges are even in number, beginning from 4 and higher. Depending on the exact number, they provide formation of a wave operating mode of the $TE_{n1}$ type, where n=2, 3, 4, . . . , inside the waveguide. This can be seen in FIGS. 1 and 2A–2C. The innermost surface 18 of each of ridges 16 are made arc-wise in transversal cross-section, with these arcs constituting parts of a circle concentric with the circle of inner surface 14. Arrows 20 show electric field lines.

In principle, the larger the diameter of the applicator or the corrugated waveguide, the larger the n.

Figure 3:
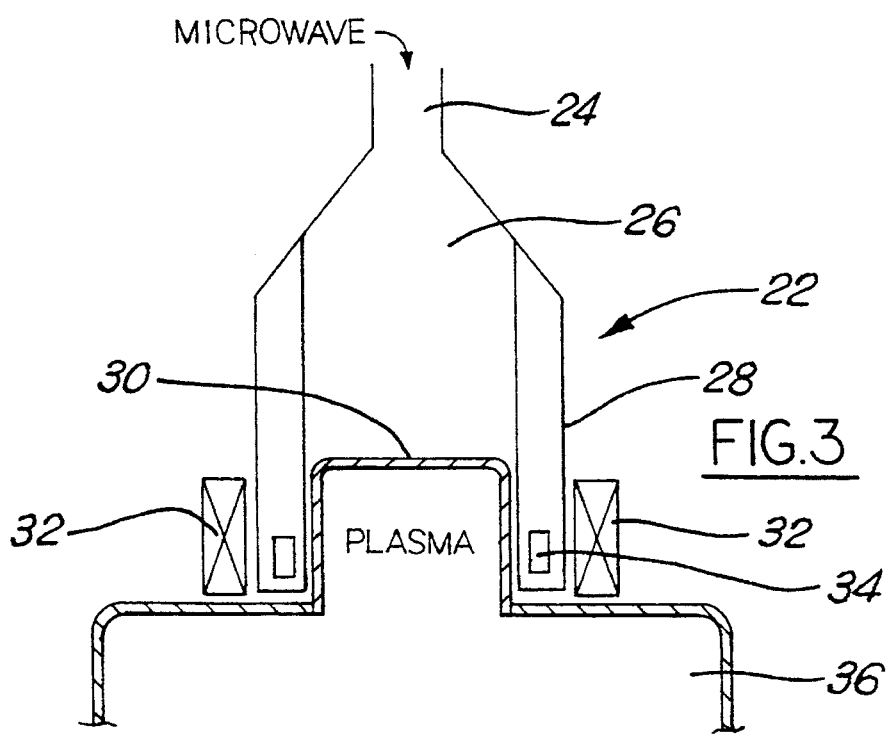
FIG. 3 is a cross sectional view of a part of an electron cyclotron resonance system in accordance with a second aspect of the present invention.

Shown in FIG. 3, an example of an electronic cyclotron resonance microwave plasma system 22 using the waveguide in accordance with the first aspect of the present invention comprises a means for producing microwaves (not shown) for which means any of suitable conventional and available on the market magnetrons can be used for example.

A transmission means for bringing the microwaves generated in the magnetron mentioned above to an applicator is shown as a transmission line 24. It can be either a coaxial line for carrying microwaves having TM mode, or a rectangular waveguide for conveying a $TE_{01}$ mode microwave, or a cylindrical waveguide with a $TE_{11}$ mode microwave.

There is a mode transition section 26 between transmission line 24 and applicator 28. The purpose of the section is obvious from its name. Also, there could be provided a means for tuning microwaves such as a movable short-circuiting slide (not shown).

A horn shaped mode transition section 26 converts to applicator 28 which is in fact a corrugated (ridged) waveguide of the type discussed in the above and depicted in FIGS. 1, 2. For designing the applicator when designing the system, an MSC/EMAS software based on a finite element method was employed.

With its lowermost part, applicator 28 embraces a bell jar shape quartz chamber 30 serving for burning a plasma. In turn, this lowermost part of applicator 28 is surrounded by a source 32 of magnetic field. This source 32 can be either a magnetic coil that can be seen in FIG. 3, or magnets (not shown), or a combination thereof. Also provided in the end part of applicator 28 is a strap 34. Strapping is a well known expedient in a waveguide technique, and straps in fact are conductors (wires, flat strips, or flat annulus) connected to alternate segments (ridges) of the waveguide and serving the function of mode separation.

Communicating with quartz chamber 30 is a working vacuum chamber 36 for plasma processing products.

Plasma produced through the use of the waveguide according to the present invention makes it possible to work with wafers sizes of about 200 mm.

While the present invention has been described in an illustrative manner, it should be understood that the terminology used is intended to be in a nature of words of description rather than of limitation. Furthermore, while the present invention has been described in terms of a preferred embodiments thereof, it is to be appreciated that those skilled in the art will readily apply these teachings to other possible variations of the invention without departing from its spirit and scope.

The embodiments of the invention in which an exclusive property is claimed are defined as follows:

I claim:

1. A corrugated waveguide for a microwave plasma applicator comprising a body and a plurality of ridges, said body having an outer surface and an inner surface, said inner surface having a circular transversal cross-section, ridges of said plurality of ridges longitudinally extending along a direction of wave propagation in said waveguide, said ridges being arranged on said internal surface and uniformly spaced thereabout, and being 2n in number to provide an operation mode of $TE_{n1}$ where n is an integer and n>1, said ridges are identical in form and each of said ridges constitutes a truncated sector in a transversal cross-section, with an innermost surface of each of said ridges being arc-wise and concentric with said inner surface of said body.

2. An electron cyclotron resonance system for plasma processing, said system comprising: a means for producing microwaves; a transmission means for bringing said microwaves to an applicator, said transmission means containing a horn shaped radiator; a quartz chamber for burning a plasma, said quartz chamber being inserted in said applicator and having a bell jar shape; a source of magnetic field surrounding said applicator in an area thereof accommodating said quartz chamber; and a working chamber for plasma processing products, said working chamber communicating with said quartz chamber, wherein said applicator includes a corrugated waveguide comprising a body and a plurality of ridges, said body having an outer surface and an inner surface, said inner surface having a circular cross-section, ridges of said plurality of ridges longitudinally extending along a direction of wave propagation in said waveguide, said ridges being arranged on said internal surface and uniformly spaced thereabout and being 2n in number to provide an operating mode of a $TE_{n1}$ type where n is an integer and n>1.

3. The electron cyclotron resonance system for plasma processing as claimed in claim 2, wherein there are four of said ridges to provide a $TE_{21}$ operating mode.

4. The electron cyclotron resonance system for plasma processing as claimed in claim 2, wherein there are six of said ridges to provide a $TE_{31}$ operating mode.

5. The electron cyclotron resonance system for plasma processing as claimed in claim 2, wherein all of said ridges are identical in form and each of said ridges constitutes a truncated sector in a transverse cross-section, with an innermost surface of each of said ridges being arc-wise and concentric with said inner surface of said body.

6. The electron cyclotron resonance system for plasma processing as claimed in claim 2, further comprising a ring strap for microwave mode selection, said strap being located in said applicator in an end area thereof surrounded by said source of magnetic field.

* * * * *